United States Patent
Hibino

(10) Patent No.: US 7,075,121 B2
(45) Date of Patent: Jul. 11, 2006

(54) MAGNETIC TUNNELING JUNCTION ELEMENT HAVING THIN COMPOSITE OXIDE FILM

(75) Inventor: Satoshi Hibino, Hamakita (JP)

(73) Assignee: Yamaha Corporation (JP)

( * ) Notice: Subject to any disclaimer, the term of this patent is extended or adjusted under 35 U.S.C. 154(b) by 279 days.

(21) Appl. No.: 10/813,694

(22) Filed: Mar. 31, 2004

(65) Prior Publication Data

US 2004/0183091 A1    Sep. 23, 2004

Related U.S. Application Data

(63) Continuation-in-part of application No. 10/022,598, filed on Dec. 17, 2001, now Pat. No. 6,764,960.

(30) Foreign Application Priority Data

Dec. 20, 2000    (JP)    ............... 2000-386449

(51) Int. Cl.
  *H01L 29/88*    (2006.01)
(52) U.S. Cl. .............. 257/104; 267/E29.339; 438/979
(58) Field of Classification Search .......... 257/104, 257/105, 106, E29.399; 437/979
See application file for complete search history.

(56) References Cited

U.S. PATENT DOCUMENTS

| 5,986,858 | A | 11/1999 | Sato et al. |
| 6,655,006 | B1 * | 12/2003 | Pinarbasi ............... 29/603.07 |
| 6,661,626 | B1 * | 12/2003 | Gill ............... 360/324.2 |
| 6,669,787 | B1 * | 12/2003 | Gillies et al. ............. 148/277 |
| 6,839,206 | B1 * | 1/2005 | Saito et al. ............. 360/324.2 |
| 6,897,532 | B1 * | 5/2005 | Schwarz et al. .......... 257/367 |

FOREIGN PATENT DOCUMENTS

| JP | 2000-036628 | 2/2000 |
| JP | 2000-091668 | 3/2000 |
| JP | 2002-190632 | 7/2002 |

\* cited by examiner

*Primary Examiner*—Tuan N. Quach
(74) *Attorney, Agent, or Firm*—Dickstein, Shapiro, Morin & Oshinsky, LLP.

(57) ABSTRACT

A tunneling junction element comprises: a substrate; a lower conductive layer formed on the substrate; a first oxide layer formed on the lower conductive layer and having a non-stoichiometric composition; a second oxide layer formed on the first oxide layer and having a stoichiometric composition; and an upper conductive layer formed on the second oxide layer, wherein the first oxide layer is oxidized during a process of forming the second oxide layer and has an oxygen concentration which is lower than an oxygen concentration of the second oxide layer and lowers with a depth in the first oxide layer, and the first and second oxide layers form a tunneling barrier.

8 Claims, 8 Drawing Sheets

MAGNETIC TUNNELING JUNCTION ELEMENT HAVING THIN COMPOSITE OXIDE FILM

CROSS REFERENCE TO RELATED APPLICATION

This application is based on and claims priority on Japanese patent application 2000-386449, filed on Dec. 20, 2000, the whole contents of which are incorporated herein by reference, and is a continuation-in-part of U.S. patent application Ser. No. 10/022,598 filed on Dec. 17, 2001 now U.S. Pat. No. 6,764,960.

BACKGROUND OF THE INVENTION

A) Field of the Invention

The present invention relates to a magnetic tunneling junction element having an oxide film such as alumina (aluminum oxide) film.

B) Description of the Related Art

Magnetic tunneling junction elements are known as megnetoresistive elements to be used for magnetic heads, magnetic memories, magnetic sensors and the like. As a magnetic tunneling junction element manufacture method, a method as illustrated in FIGS. 10 to 12 is known (e.g., JP-A-2000-91668).

In the process illustrated in FIG. 10, on the surface of a ferromagnetic layer 1 made of Fe or the like, an aluminum film 2 of 2 nm in thickness is formed by sputtering. Next, pure oxygen is introduced into a sputtering chamber, and the aluminum layer 2 is oxidized for 10 minutes by setting an oxygen pressure in a range from 20 mTorr to 200 Torr. An alumina film 3 is therefore formed on the surface of the aluminum film 2 as shown in FIG. 11. This alumina film 3 is used as a tunneling barrier film. Thereafter, in the process illustrated in FIG. 12, a ferromagnetic layer 4 made of Co—Fe alloy or the like is formed on the alumina film 3 by sputtering.

As a method of forming an alumina film as a tunneling barrier film, other methods are also known, including (a) a method of exposing an aluminum film in the air to make it subject to natural or native oxidation and (b) a method of subjecting an aluminum film to a plasma oxidation process (for the method (a), refer to JP-2000-91668, and for the method (b), refer to JP-2000-36628).

With the conventional method (b), oxidation becomes likely to be too excessive so that an underlying ferromagnetic layer may be oxidized at the interface with the tunneling barrier film and the variation in a magnetic tunneling resistance may become lower.

With the conventional method (a), it takes a long time, several hours, to complete the oxidation process so that the tunneling barrier film may be formed with pin holes or contaminated by the presence of dusts in the air and the film quality may be degraded.

Although the method illustrated in FIGS. 10 to 12 is an improved method of the method (a), an aluminum film 2 not oxidized is likely to be left under the alumina film 3 as shown in FIG. 11. The left aluminum film 2 lowers the variation in the magnetic tunneling resistance. If oxidation of the aluminum film is insufficient, an electrostatic breakdown voltage of the magnetic tunneling junction element lowers and a time-dependent change in the variation in the magnetic tunneling resistance becomes large when the magnetic tunneling junction element is placed in a high temperature environment. From these reasons, the reliability of a magnetic tunneling junction element lowers.

SUMMARY OF THE INVENTION

It is an object of the present invention to provide a novel magnetic tunneling junction element having a thin oxide film which can be formed in a short time without oxidizing an underlying layer.

It is another object of the invention to provide a novel magnetic tunneling junction element capable of improving the variation in a magnetic tunneling resistance, the electrostatic breakdown voltage, reliability and productivity of the tunneling junction element.

According to one aspect of the present invention, there is provided a tunneling junction element comprising: a substrate; a lower conductive layer formed on said substrate; a first oxide layer formed on said lower conductive layer and having a non-stoichiometric composition; a second oxide layer formed on said first oxide layer and having a stoichiometric composition; and an upper conductive layer formed on said second oxide layer, wherein said first oxide layer is oxidized during a process of forming said second oxide layer and has an oxygen concentration which is lower than an oxygen concentration of said second oxide layer and lowers with a depth in said first oxide layer, and said first and second oxide layers form a tunneling barrier.

DESCRIPTION OF THE PREFERRED EMBODIMENTS

Figure 1:
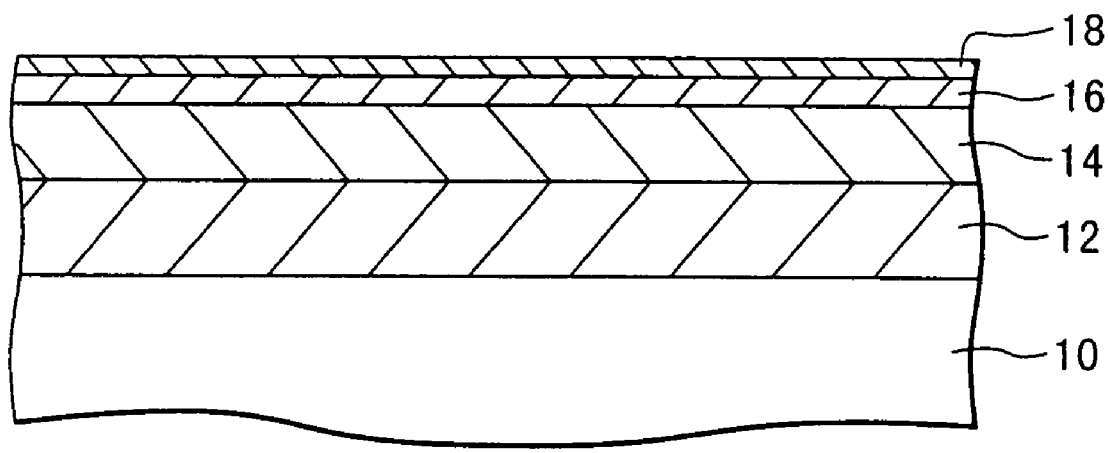
FIG. 1 is a cross sectional view of a substrate illustrating an aluminum film forming process in a method of manufacturing a magnetic tunneling junction element according to an embodiment of the invention.
Figure 2:
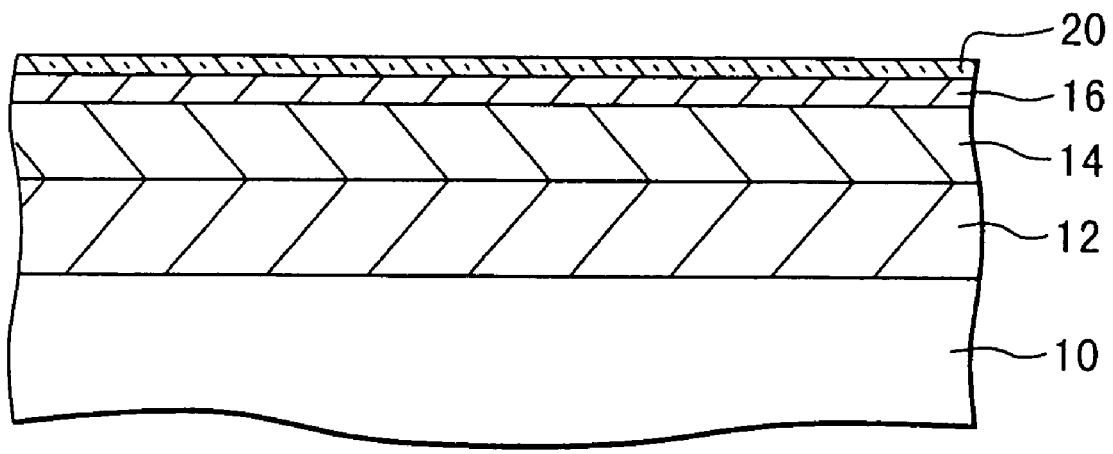
FIG. 2 is a cross sectional view of the substrate illustrating an alumina film forming process following the process illustrated in FIG. 1.

FIGS. 1 to 6 illustrate a method of manufacturing a magnetic tunneling junction element according to an embodiment of the invention.

Processes (1) to (6) corresponding to FIGS. 1 to 6 will be described in this order.

(1) A substrate 10 is prepared which is a silicon substrate having a thermally oxidized insulating silicon oxide film on the surface of the substrate. As the substrate 10, a substrate made of glass or quartz may also be used.

On the surface of the substrate 10, an electrode layer 12 is formed which is made of a Ti layer having a thickness of 15 nm and a Cu layer having a thickness of 300 nm sequentially formed by sputtering. The electrode layer 12 is not limited to a lamination of the Cu layer stacked upon the Ti layer. For example, it may be a single layer made of Cr or Ti. Next, an antiferromagnetic layer 14 is formed on the electrode layer 12 by sputtering, the antiferromagnetic layer 14 being made of a Pt—Mn alloy layer having a thickness of 50 nm. Instead of Pt—Mn alloy, other materials such as Rh—Mn alloy and Fe—Mn alloy may be used as the material of the antiferromagnetic layer 14.

A ferromagnetic layer 16 is formed on the antiferromagnetic layer 14 by sputtering, the ferromagnetic layer 16 being made of a Ni—Fe alloy layer having a thickness of 6 nm. Instead of Ni—Fe alloy, other metal such as Ni, Fe, or Co, other alloy or intermetallic compound of two or more metals among Ni, Fe and Co, or other material may also be used.

Next, an aluminum film 18 is formed on the ferromagnetic layer 16 by sputtering. For example, the thickness of the aluminum film 18 is 0.3 to 2 nm, e.g. about 1.5 nm. In forming the aluminum film 18, a pure aluminum target is used. The sputtering conditions are, for example:

Ar gas pressure: 8 mTorr

DC power: 100 W

Substrate Temperature: room temperature

Film Forming Time: 10 sec.

(2) An alumina film 20 is formed on the ferromagnetic layer 16 through deposition of an alumina film and oxidation of the aluminum film. For example, in the same sputtering chamber as that in which the aluminum film 18 was formed, the supply of Ar gas is stopped and then $O_2$ gas is introduced. In this oxidizing atmosphere, an alumina film is formed by reactive sputtering. The thickness of the deposited alumina film is, for example, 0.1 to 0.5 nm, e.g. about 0.5 nm. In this case, the pure aluminum target used for the aluminum film 18 is also used. The sputtering conditions are, for example:

$O_2$ gas pressure: 8 mTorr

DC power: 100 W

Substrate Temperature: room temperature

Film Forming Time: 10 sec.

Under these conditions, an alumina film 20 having a uniform thickness can be formed, and the thickness of the total alumina film 20 becomes 0.5 to 2.5 nm.

Figure 9A:
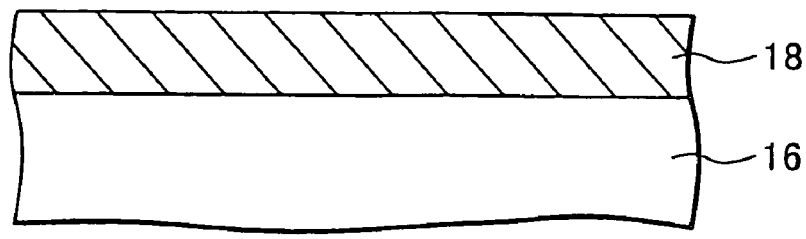
FIGS. 9A to 9C are cross sectional views illustrating a progress of oxidation in an aluminum film 18.
Figure 9B:
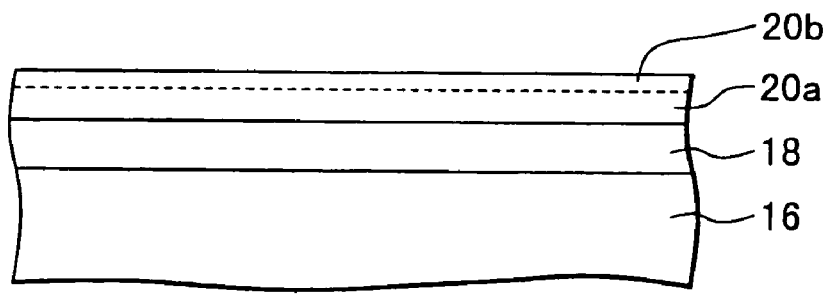
Figure 9C:
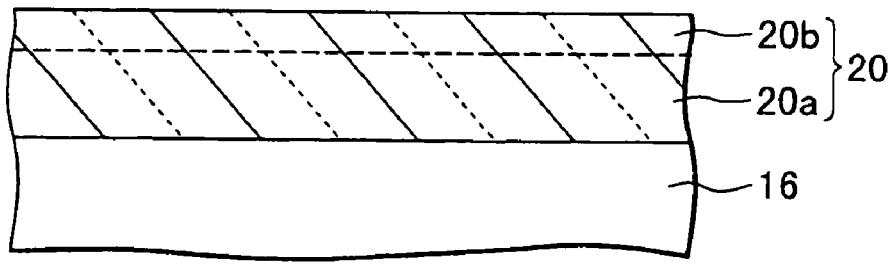
Figure 10:
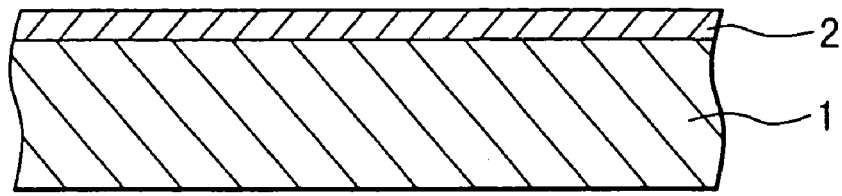
FIG. 10 is a cross sectional view illustrating an aluminum film forming process in a conventional method of manufacturing a magnetic tunneling junction element.
Figure 11:
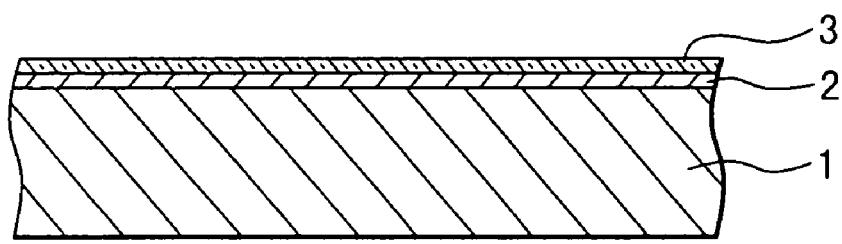
FIG. 11 is a cross sectional view illustrating an alumina film forming process following the process shown in FIG. 10.
Figure 12:
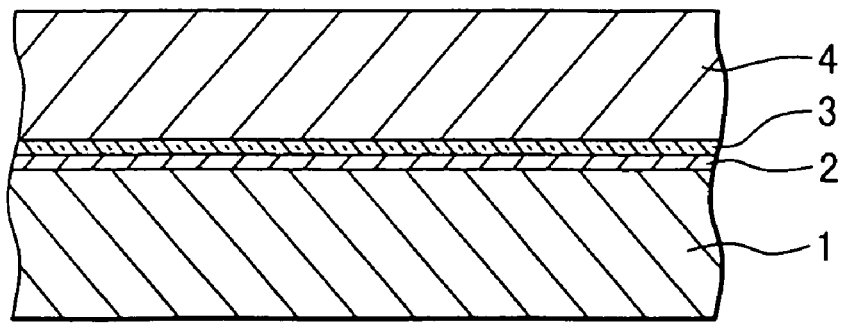
FIG. 12 is a cross sectional view illustrating an ferromagnetic layer forming process following the process shown in FIG. 11.

FIGS. 9A to 9C are diagrams illustrating the progress of oxidation in the aluminum film 18. After the aluminum film 18 is formed on the ferromagnetic film 16 by sputtering as shown in FIG. 9A, an alumina film 20b is formed by reactive sputtering as shown in FIG. 9B. In this case, the aluminum film 18 is oxidized by the presence of $O_2$ gas and the function of $O_2$ plasma during the reactive sputtering process, and transformed into an alumina film 20a. Therefore, the alumina film 20 obtained after the completion of the reactive sputtering process contains the alumina film 20a made by oxidizing the whole thickness of the aluminum film 18 without leaving the aluminum film and the deposited alumina film 20b, as shown in FIG. 9C. By setting the thickness of the second alumina film 20b to the thickness required for completely oxidizing just the whole thickness of the aluminum film 18, it is possible to oxidize only the aluminum film 18 and prevent the oxidation of the ferromagnetic layer 16. The thickness of the aluminum film 18 is usually 1 to 2 nm. The thickness of the second alumina film 20b is set to the thickness required for completely oxidizing the aluminum film 18 having such a thickness. However, it is practically difficult to completely oxidize the aluminum layer 18 and not to oxidize the ferromagnetic layer 16 at all. If a film structure regarded effectively as such a structure can be obtained, it can be said that the whole thickness of the conductive layer is substantially oxidized and the ferromagnetic layer is not substantially oxidized. The reactive sputtering process may be performed in another sputtering chamber different from the sputtering chamber used for the previous sputtering process.

(3) Next, a ferromagnetic layer 22 is formed on the alumina film 20 by sputtering, the ferromagnetic layer 22 being made of an Ni—Fe alloy layer having a thickness of 80 nm. Instead of Ni—Fe alloy, the ferromagnetic layer 22 may be made of other ferromagnetic materials similar to those previously described for the ferromagnetic layer 16.

(4) Next, the lamination from the electrode layer 12 to the ferromagnetic layer 22 is patterned by an ion milling process using as a mask a resist pattern having a pattern same as a predetermined lower electrode pattern. A lower electrode layer 12A made of the remaining electrode layer 12 is therefore formed. Thereafter, the resist pattern is removed.

Figure 4:
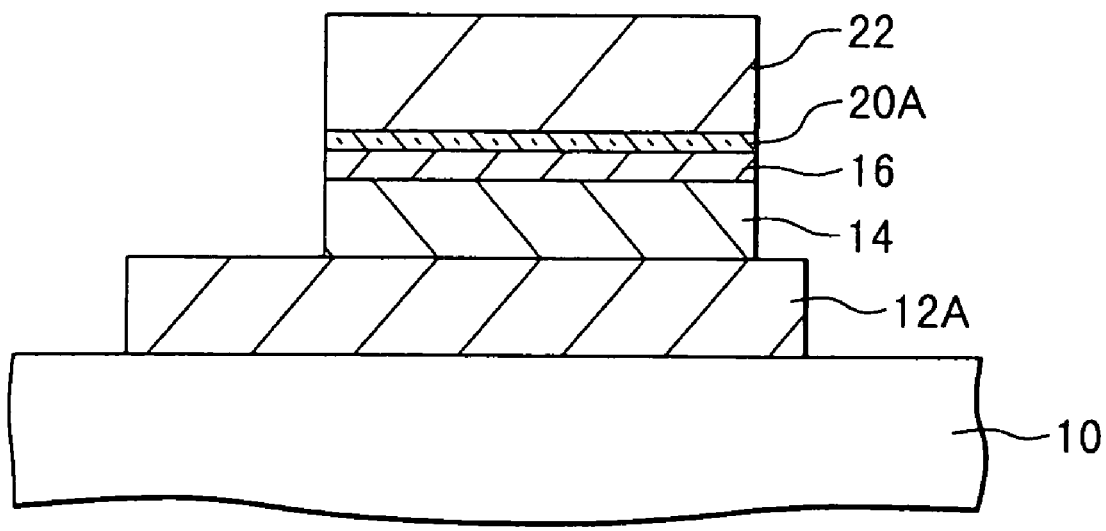
FIG. 4 is a cross sectional view of the substrate illustrating an ion milling process following the process illustrated in FIG. 3.

Next, the lamination from the antiferromagnetic layer 14 to the ferromagnetic layer 22 is patterned by an ion milling process using as a mask a predetermined resist pattern. On the electrode layer 12A, a lamination which is made of the antiferromagnetic layer 14, ferromagnetic layer 16, alumina film 20A and ferromagnetic layer 22 is therefore left, as shown in FIG. 4. Thereafter, the resist pattern is removed. The alumina film 20A is used as a tunneling barrier film.

(5) Next, the ferromagnetic layer 22 is patterned by an ion milling process using a resist pattern having a pattern same as a predetermined element pattern. On the tunneling barrier film 20A, the ferromagnetic layer 22 having a plan shape of a rectangle, e.g., a longer side length of 120 μm and a shorter side length of 20 μm is therefore left. Thereafter, the resist pattern is removed.

(6) An interlayer insulating film 24 is formed over the substrate 10 by sputtering, the interlayer insulating film being made of a silicon oxide film and having a thickness of 1000 nm. Contact holes exposing a partial area of the ferromagnetic layer 22 and the electrode layer 12A are formed through the insulating film 24 by ion milling process using a resist mask pattern. This resist mask pattern is thereafter removed. Then, an electrode layer is formed over the insulating film 24, the electrode layer being made of a copper layer having a thickness of 300 nm. This copper layer is patterned to have a predetermined upper electrode pattern so that upper electrode layers 26 connected to the ferromagnetic layer 22 and the electrode layer 12A can be formed.

Figure 5:
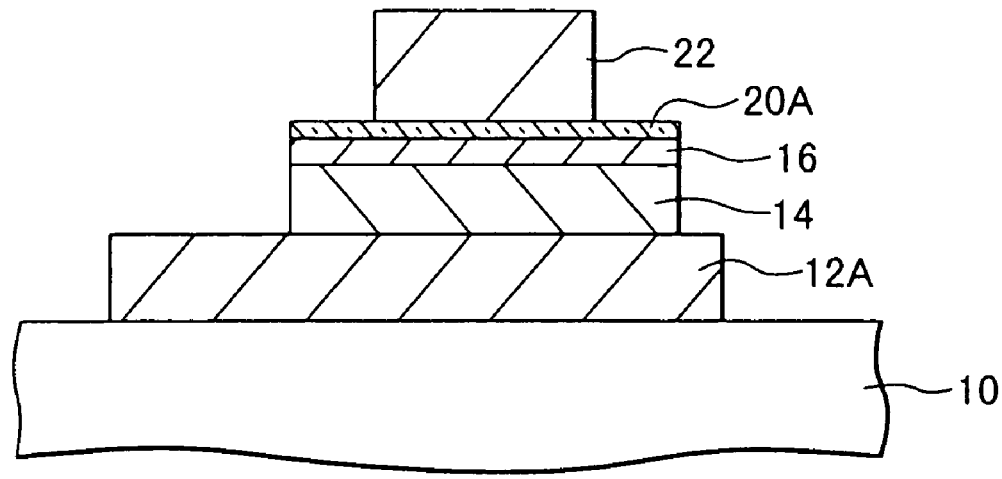
FIG. 5 is a cross sectional view of the substrate illustrating an ion milling process following the process illustrated in FIG. 4.
Figure 6:
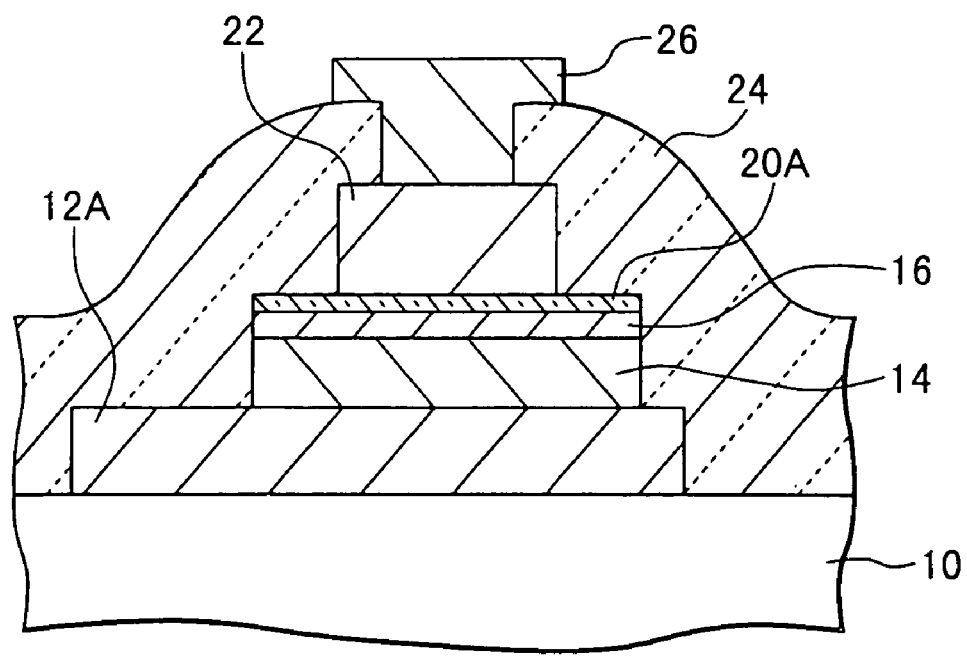
FIG. 6 is a cross sectional view of the substrate illustrating an insulating film forming process and an electrode layer forming process following the process illustrated in FIG. 5.

In the embodiment described above, although the shape of the ferromagnetic layer 22 is decided at the process shown in FIG. 5, carried out after the process shown in FIG. 4, the process shown in FIG. 6 may be performed directly after the process of FIG. 4, omitting the process shown in FIG. 5. In this case, the final shape of the ferromagnetic layer 22 is the same as the shape of the ferromagnetic layer 22 shown in FIG. 4. In the magnetic tunneling junction element shown in FIG. 6, the antiferromagnetic layer 14 functions to fix the magnetization direction of the ferromagnetic layer 16, and the ferromagnetic layer 16 becomes a fixed layer. The ferromagnetic layer 22 has a free magnetization direction (not fixed) and becomes a free layer.

In the state that a predetermined current is allowed to flow between the electrode layers 12A and 26, as an external magnetic field is applied along an in-plane direction of the ferromagnetic layer 22, a relative magnetization angle between the ferromagnetic layers 16 and 22 changes with the direction and intensity of the applied magnetic field, and the electric resistance between the electrode layers 12A and 26 changes with a change in the relative magnetization angle. The resistance value becomes minimum if the magnetization directions are parallel, and maximum if they are antiparallel. Therefore, a magnetic field can be detected from a change in the resistance value.

Figure 7:
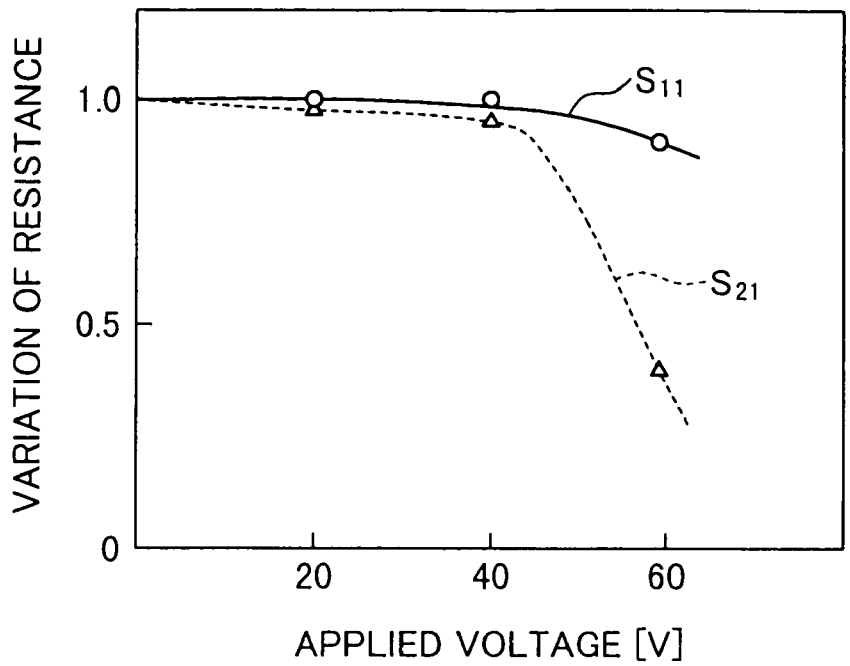
FIG. 7 is a graph showing electrostatic breakdown voltage characteristics of an embodiment magnetic tunneling junction element and a conventional magnetic tunneling junction element.

FIG. 7 is a graph showing electrostatic breakdown voltage characteristics of an embodiment magnetic tunneling element and a conventional magnetic tunneling element. The embodiment magnetic tunneling junction element was manufactured by a method similar to that illustrated in FIGS. 1 to 6 (the shape of the ferromagnetic layer 22 decided by the process shown in FIG. 4 was used and the process shown in FIG. 5 was omitted). The conventional magnetic tunneling junction element was manufactured by a similar method used for the embodiment magnetic tunneling junction element, excepting that the tunneling barrier film (corresponding to the film 20A shown in FIG. 4) was formed by a natural oxidation method (exposing the aluminum film to the air).

In FIG. 7, the abscissa represents a voltage (V) applied across a pair of electrode layers (12A and 26 in FIG. 6), and the ordinate represents a rate of change in the electric resistance between the pair of electrode layers. Curves $S_{11}$ and $S_{21}$ indicate the electrostatic breakdown voltage characteristics of the embodiment and conventional magnetic tunneling junction elements respectively. At an applied voltage of 60V, characteristic $S_{21}$ shows a reduced resistance, indicating dielectric breakdown. As seen from FIG. 7, it can be understood that the embodiment magnetic tunneling junction element has a higher electrostatic breakdown voltage than the conventional magnetic tunneling junction element.

Figure 8:
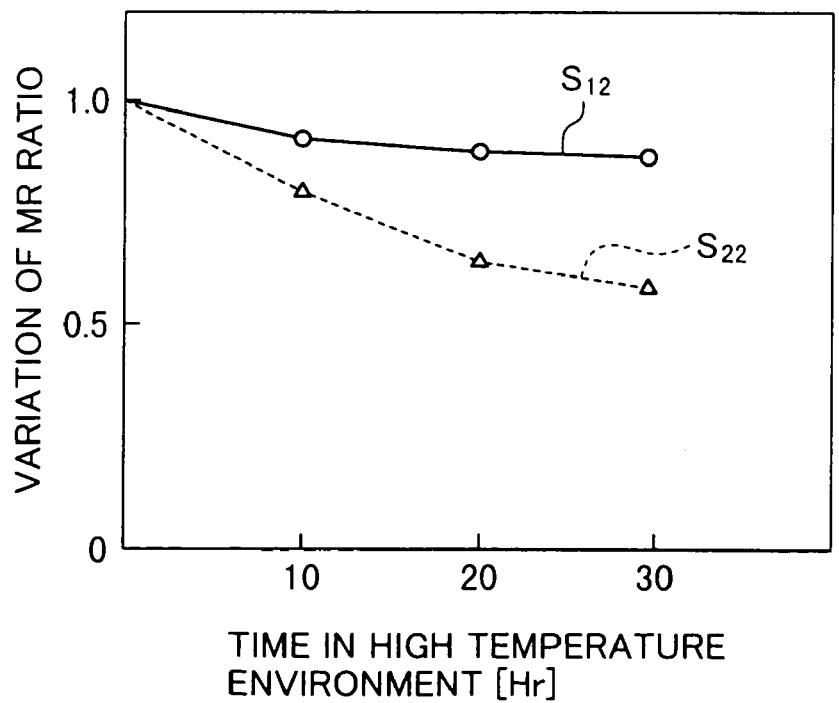
FIG. 8 is a graph showing time-dependent variation in the characteristics of MR ratios in a magnetic tunneling junction element of an embodiment and a conventional magnetic tunneling junction element when they are placed in a high temperature environment.

FIG. 8 is a graph showing the time-dependent change of an MR ratio of the embodiment and conventional magnetic tunneling junction elements when they are placed in an environment of a high temperature of 280° C. The magnetic tunneling junction elements used for the measurement of the characteristics are similar to those described with reference to FIG. 7. An MR ratio is a ratio of the maximum magnetic tunneling resistance to the minimum magnetic tunneling resistance. Curves $S_{12}$ and $S_{22}$ indicate the time-dependent change characteristics of the embodiment and conventional magnetic tunneling junction elements, respectively. As seen from FIG. 8, it can be understood that the embodiment magnetic tunneling junction element has a smaller time-dependent change in the MR ratio and a higher reliability than the conventional magnetic tunneling junction element.

The times required for forming the tunneling barrier film of the embodiment and conventional magnetic tunneling junction elements were compared. It took two minutes per one substrate (wafer) for the embodiment element, and it took 180 minutes per one substrate for the conventional element. The magnetic tunneling junction elements used for the comparison were similar to those described with reference to FIG. 7. The time taken to form the tunneling barrier film of the embodiment element includes the time taken to form the aluminum film and alumina film as well at the time taken for loading and unloading the substrate into and from a sputtering chamber. The embodiment manufacture method can shorten greatly the time taken to form the tunneling barrier film and improve the productivity.

According to this embodiment, after a conductive film is formed by depositing conductive material on an underlying layer capable of being oxidized, the conductive film is oxidized while oxide of the conductive material is deposited on the conductive film by reactive sputtering in an oxidizing atmosphere. Accordingly, oxidation of the underlying layer can be prevented because of the presence of the conductive film, and oxidation of the conductive film is suppressed more as the oxide of the conductive material deposited becomes thicker. Namely, the conductive film is not positively subjected to the oxidation process, but the phenomenon is utilized by which phenomenon the conductive film is oxidized while the oxide of the conductive material is deposited on the conductive film by reactive sputtering in an oxidizing atmosphere.

According to this embodiment, during the reactive sputtering in the oxidizing atmosphere, oxygen plasma reacts also with the conductive film so that the conductive film can be oxidized sufficiently even at a low temperature. The composite oxide film of a good quality can be formed which has the first oxide film of the oxidized conductive film and the second oxide film of the deposited oxide. Since the sputtering process is used, a thin oxide film can be formed in a short time.

In forming an oxide film, as the conductive material, metal such as aluminum, titanium and magnesium or semiconductor such as silicon can be used.

Since the tunneling barrier film made of the first and second oxide films can be formed by oxidizing only the conductive film without oxidizing the first ferromagnetic layer, variation in the magnetic tunneling resistance can be improved. Since an oxide film of a good quality to be used as the tunneling barrier layer can be formed in a short time, the electrostatic breakdown voltage, reliability and productivity of magnetic tunneling junction elements can be improved.

As above, an oxide film of a good quality can be formed on the underlying layer in a short time without oxidizing the underlying layer.

The oxide film is used as the tunneling barrier film, to improve the variation in magnetic tunneling resistance, electrostatic breakdown voltage, reliability and productivity.

What phenomena occurred on the surfaces and the like of aluminum layers was checked by using samples with scaled-up thicknesses. Each sample was formed by forming an aluminum layer by sputtering and forming an alumina layer on the aluminum layer by reactive sputtering.

Figure 13A:
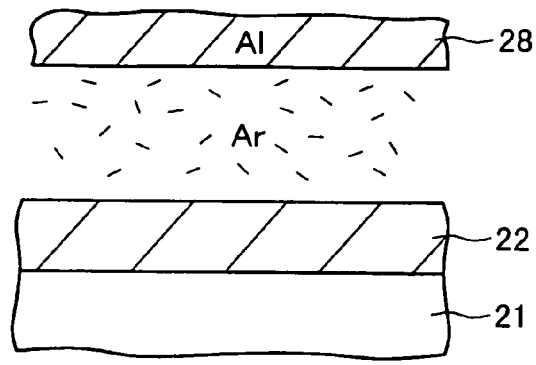
FIGS. 13A to 13E are schematic diagrams illustrating the process of manufacturing an aluminum oxide layer having a non-stoichiometric composition, in two different conditions.

As shown in FIG. 13A, an aluminum layer 22 having a thickness of 100 nm was formed on an underlying layer 21 in a sputtering chamber. The sputtering conditions were a pure Al target 28, an Ar gas (flow rate of 80 sccm, pressure of 8 mTorr) and a DC power of 100 W. The aluminum layer 22 was formed sufficiently thick to the extent that the whole thickness of the aluminum layer 22 is not oxidized during the succeeding reactive sputtering process.

The underlying layer is formed of an oxidizable material. Oxide materials such as $CrO_x$ will not be used. There is a possibility that an unintentional native oxide film exists at the film surface, and it is impossible to avoid formation of a very thin native oxide film. Such a native oxide film may be excluded from the consideration.

Figure 13B:
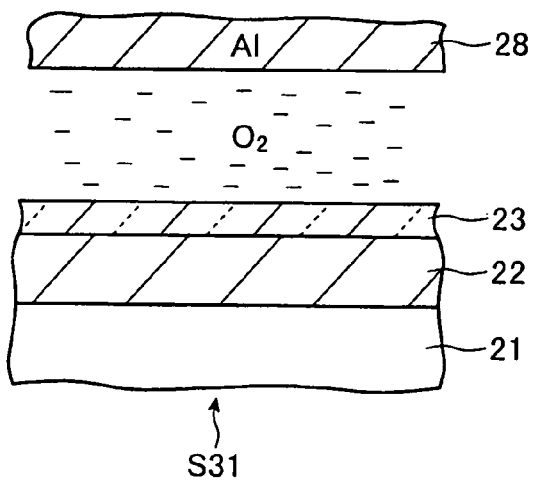

As shown in FIG. 13B, a first sample S31 was formed in the following manner. On the aluminum layer 22 of 100 nm in thickness, an aluminum oxide layer 23 having a thickness of about 5 nm was formed in the same sputtering chamber by reactive sputtering (DC power of 100 W) by changing the work gas to $O_2$ (100%, flow rate of 80 sccm, pressure of 8 mTorr). The reactive sputtering conditions were the same as those of the above-described embodiment.

The work gas $O_2$ can be considered having the functions of: sputtering aluminum; oxidizing flying aluminum particles (depositing the aluminum oxide layer 23); forming aluminum oxide by bonding to aluminum on the surface of the underlying aluminum layer 22; oxidizing the aluminum layer 22 because $O_2$ attached to the surface of the aluminum layer 22 is knocked on by flying particles and moved into the aluminum layer 22; and the like.

Figure 13C:
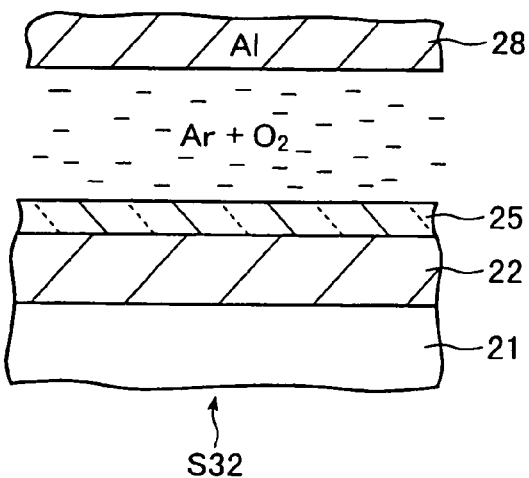

As shown in FIG. 13C, a second sample S32 was formed in the following manner. On the aluminum layer 22 of 100 nm in thickness, an aluminum oxide layer 25 having a thickness of about 5 nm was formed in the same sputtering chamber by reactive sputtering (DC power of 100 W) by changing the work gas to $O_2(50\%)+Ar(50\%)$ ($O_2$ flow rate of 40 sccm, Ar flow rate of 40 sccm, total pressure of 8 mTorr), instead of using $O_2$ gas (100%). By using the work gas $O_2$ (50%)+Ar(50%) instead of $O_2$ gas (100%), oxidation of the work gas was made weak. Although reactive sputtering similar to FIG. 13B can be performed by using the work gas which contains $O_2$, the ability of oxidation is weak in correspondence with the reduced amount of $O_2$. Since Ar has a higher sputtering rate than $O_2$, a film forming speed increases.

The samples S31 and S32 formed with the aluminum oxide layers 23 and 25 were analyzed with a spectral ellipsometer. The refractive index shows the value at a wavelength of 400 nm.

Figure 13D:
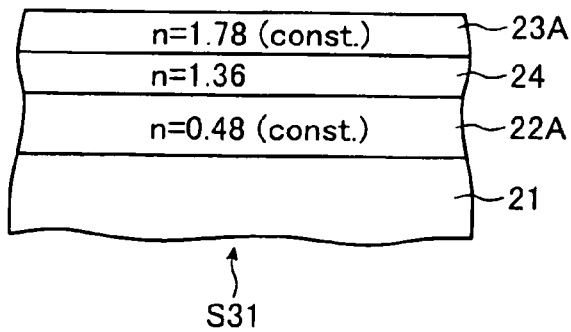

FIG. 13D shows a refractive index distribution in the first sample S31 shown in FIG. 13B. A layer 24 having an effective refractive index n=1.36 was observed between a layer 22A and a layer 23A. The layer 22A had a constant refractive index n=0.48 and can be considered the aluminum layer 22. The layer 23A had a constant refractive index n=1.78 and can be considered the aluminum oxide layer 23.

Figure 13E:
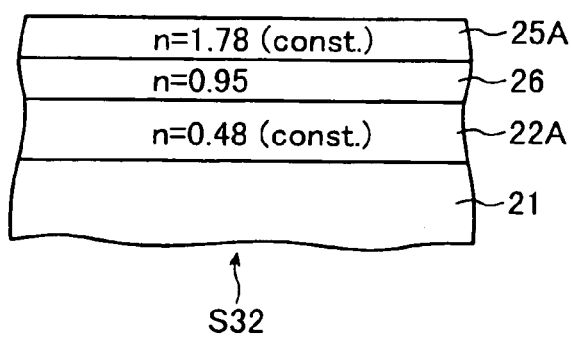

FIG. 13E shows a refractive index distribution in the second sample S32 shown in FIG. 13C. A layer 26 having an effective refractive index n=0.95 was observed between a layer 22A and a layer 25A. The layer 22A had a constant refractive index n=0.48 and can be considered the aluminum layer 22. The layer 25A had a constant refractive index n=1.78 and can be considered the aluminum oxide layer 25.

Even if the oxygen pressure in the work gas is changed between 8 mTorr and 4 mTorr, the refractive index of the deposited aluminum oxide layers 23A and 25A will not change maintaining at n=1.78. It can be considered that alumina ($Al_2O_3$) having a stoichiometric composition is formed.

The layers 24 and 26 formed adjacent to the deposited aluminum oxide layers (formed by oxidation of the aluminum layers) have the refractive indices n=1.36 and 0.95 which are apparently lower than the refractive index n=1.78 of stoiciometric aluminum oxide. These layers 24 and 26 can be considered the aluminum oxide layers having a non-stoichiometric composition rich in aluminum. As the oxygen pressure is reduced by a half from 8 mTorr to 4 mTorr, the refractive index of the aluminum oxide layer 26 having a non-stoichiometric composition is reduced from 1.36 to 0.95 to be considered richer in aluminum. Since aluminum oxide has a barrier characteristic relative to oxygen, depositing an aluminum oxide layer thick to some degree may suppress oxidation of the aluminum layer. It can be considered that the oxygen pressure at the initial stage of reactive sputtering influences greatly the composition of aluminum oxide having a non-stoichiometric composition.

The above experiment results indicate the following facts, when an aluminum layer is formed by sputtering using a pure Al target and an aluminum oxide layer is deposited on the aluminum layer by reactive sputtering using a pure Al target and a work gas which contains oxygen: 1) aluminum oxide having a stoichiometric composition can be deposited in a wide oxygen pressure range; 2) the aluminum layer in contact with the aluminum oxide layer is oxidized and aluminum oxide having a non-stoichiometric composition is formed; and 3) the composition of aluminum oxide having a non-stoichiometric composition changes with the oxygen pressure (or flow rate) of the atmosphere.

If the alumina film 20b of the above-described embodiment is formed by using a mixture gas of $O_2$+Ar and lowering the oxygen flow rate, it is expected to reduce the oxygen composition of the aluminum oxide layer 20a formed by oxidation of an aluminum layer. Instead of Ar, other inert gas may be used. By lowering the oxygen flow rate at the initial stage of reactive sputtering, it is expected to regulate the thickness and oxygen concentration of the aluminum oxide layer 20a.

The aluminum oxide layer having a non-stoichiometric composition is formed theoretically by oxygen invading from the surface side. It can be considered that the oxygen concentration lowers starting from the surface of the aluminum layer down to a deeper position than the distance that oxygen invades by one phenomenon. Namely, if a secondary oxide layer thick to some degree is formed, the composition thereof has a gradient along the thickness direction.

The phenomenon that the aluminum oxide layer rich in aluminum is formed by lowering the oxygen pressure in the atmosphere during reactive sputtering, suggests that the composition distribution of the secondary oxide layer can be controlled by the oxygen pressure in the atmosphere.

Figure 14A:
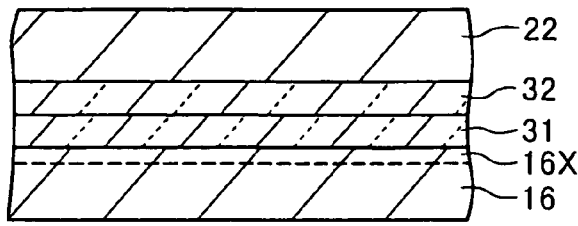
FIGS. 14A to 14E are a schematic diagram of a tunneling junction element, and graphs showing the oxygen concentration distributions in tunneling junction elements.

FIG. 14A shows an embodiment in which an aluminum oxide layer has a non-stoichiometric composition with a controlled oxygen concentration. Deposited on a lower ferromagnetic layer 16 of Ni—Fe alloy or the like are an aluminum oxide layer 31 having a non-stoichiometric composition and an aluminum oxide layer 32 having a stoichiometric composition. On the aluminum oxide layer 32, an upper ferromagnetic layer 22 of Ni—Fe alloy or the like is deposited. A natural oxide film 16x exists on the surface of the lower ferromagnetic layer 16. The natural oxide film 16x may be removed. If the natural oxide film is removed and a new tunneling insulating layer is formed, the composition and thickness of the tunneling insulating layer can be controlled at a high precision and a high performance tunneling element can be realized. If milling or the like is used for removing the natural oxide film, the surface is likely to become rough and irregular. It is not easy to form a uniform and high quality insulating layer on a rough surface. Whether the natural oxide film is to be removed or not may be determined depending upon the desired performance, conditions and the like. The other structures are similar to the previously described embodiment.

Figure 14B:
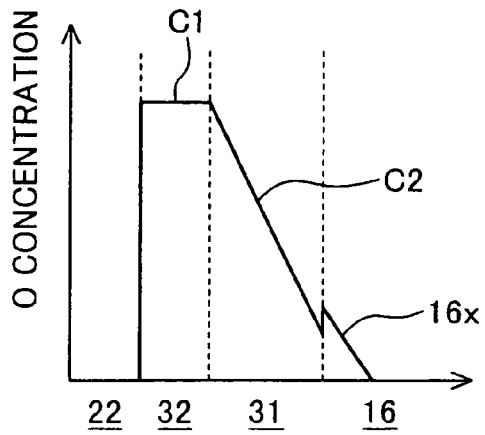

FIG. 14B is a graph showing an oxygen concentration profile in a depth direction when the natural oxide film 16x is not removed. The aluminum oxide layer 32 having a stoichiometric composition has a constant first oxygen concentration c1. The aluminum oxide layer 31 having a non-stoichiometric composition has a second oxygen concentration c2 which is lower than the first oxygen concentration c1 and lowers starting from the upper surface down to a deeper position. The oxygen concentration c2 of the aluminum oxide layer 31 having a non-stoichiometric composition decreases with the depth, and becomes lower than the oxygen concentration of the natural oxide film 16x at the interface with the lower ferromagnetic layer 16. The aluminum oxide layer 31 in the neighborhood of the surface is approximately stoichiometrically oxidized. Setting these oxygen concentrations suppresses an increase in the effective thickness of the insulating layer and realizes an efficient tunneling insulating layer.

Figure 14D:
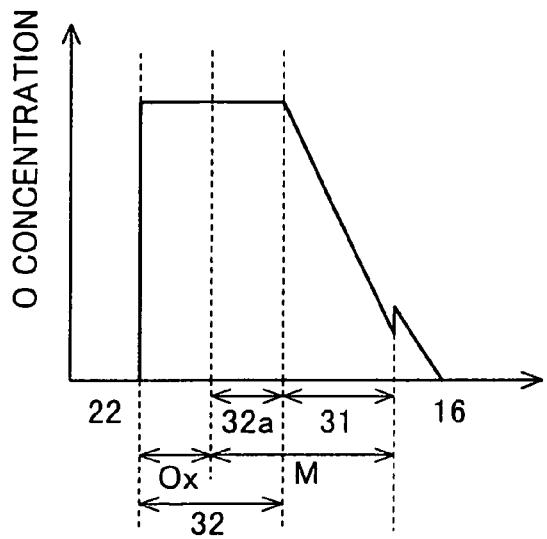
Figure 14C:
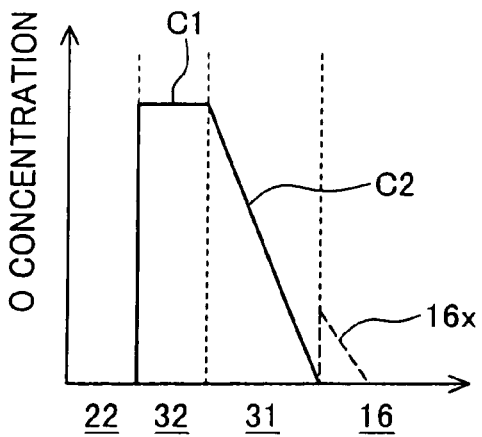

FIG. 14C is a graph showing the oxygen concentration distribution when the natural oxide film 16x is removed. Similar to FIG. 14B, the aluminum oxide layer 32 having a stoichiometric composition has the oxygen concentration c1, and the aluminum oxide layer 31 having a non-stoichiometric composition has the oxygen concentration c2. The natural oxide film 16x on the surface of the lower ferromagnetic layer 16 was removed before sputtering by Ar milling, hydrogen reduction or the like. The oxygen concentration c2 of the aluminum oxide layer 31 having a non-stoichiometric composition is set to become lower than that of the natural oxide film at the interface with the lower ferromagnetic layer 16. The aluminum oxide layer 31 in the neighborhood of the surface is approximately stoichiometrically oxidized. The oxygen concentration is set preferably to have a negligible value at the interface, i.e., one tenth or smaller than the oxygen concentration of the stoichiometric composition, or more preferably one hundredth or smaller. With this arrangement, an efficient tunneling insulating layer can be formed.

Figure 14E:
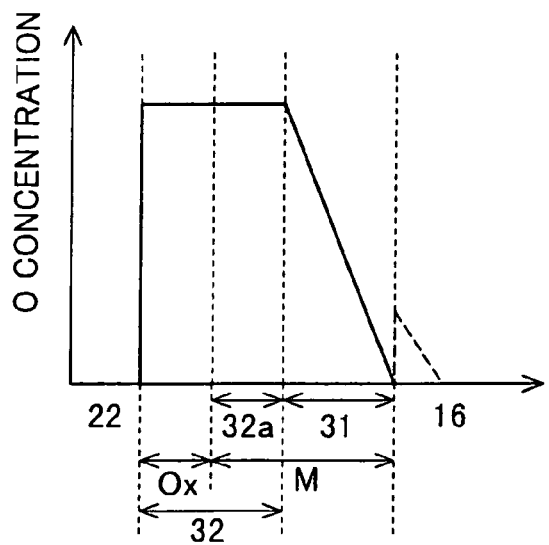

FIGS. 14D and 14E show cases where oxidation proceeds deeper than the cases of FIGS. 14B and 14C, respectively. In FIG. 14D, the surface of the ferromagnetic layer 16 has a native oxide layer. In FIG. 14E, the native oxide layer on the surface of the ferromagnetic layer 16 is removed. In FIGS. 14B and 14C only the neighborhood of the aluminum film surface is approximately stoichimetrically oxidized, whereas in FIGS. 14D and 14E a certain thickness at the surface of the aluminum film is stoichiometrically oxidized. First, a metal aluminum film M is deposited by sputtering on the ferromagnetic layer 16. Then, an aluminum oxide film Ox is reactively sputtered on the metal aluminum film M. The sputtered aluminum oxide film Ox with the oxidizing atmosphere oxidizes the underlying aluminum film M, to form a fully oxidized stoichiometric oxide layer 32a, and a partly oxidized non-stoichiometric graded oxide film 31. The deeper end of the non-stoichiometric oxide film 31 reaches the underlying ferromagnetic layer 16. The deposited stoichiometric oxide layer Ox and oxidized stoichiometric oxide layer 32a collectively constitute a stoichiometric oxide layer 32. The thicknesses of the stoichiometric oxide film 32 and the non-stoichiometric graded oxide film 31 can be controlled by controlling the conditions of the reactive sputtering.

Figure 3:
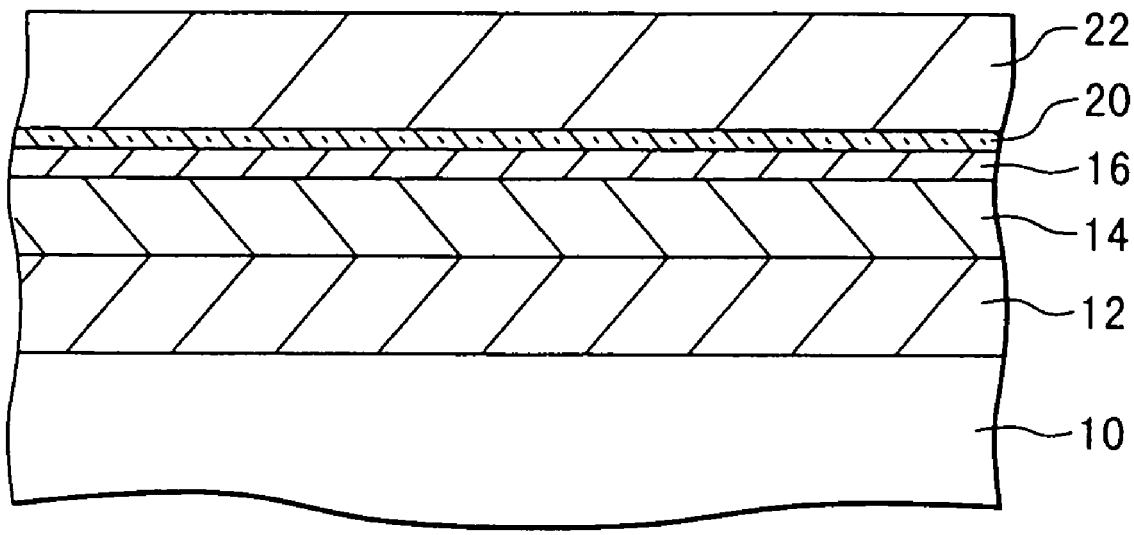
FIG. 3 is a cross sectional view of the substrate illustrating a ferromagnetic layer forming process following the process illustrated in FIG. 2.

The present invention has been described in connection with the preferred embodiments. The invention is not limited only to the above embodiments. It will be apparent to those skilled in the art that various modifications, improvements, combinations, and the like can be made. For example, the following modifications are possible:

(1) After the ferromagnetic layer 22 is formed in the process shown in FIG. 3, a conductive film having an anti-etching performance such as Mo may be formed on the ferromagnetic layer 22. In this case, it is possible to prevent the ferromagnetic layer 22 from being etched when the contact hole is formed through the insulating film 24 by selective etching in the process shown in FIG. 6.

(2) The ferromagnetic layer 22 is not limited only to a single layer structure, but it may be a multi-layer structure, e.g., a Co layer of 2 nm in thickness may be formed under a Ni—Fe alloy layer.

(3) The antiferromagnetic layer 14 may be formed on the upper ferromagnetic layer 22, to make the ferromagnetic layer 22 a fixed layer and make the ferromagnetic layer 16 a free layer.

(4) The material of the tunneling barrier layer 20A may be metal oxide or semiconductor oxide (e.g., $TiO_x$, $SiO_2$, MgO, $Al_2O_3+SiO_2$ (sialon), $CrO_x$), metal nitride or semiconductor nitride (AlN, $Si_3N_4$), metal oxynitride or semiconductor oxynitride (AlN—$Al_2O_3$) or the like.

$CrO_x$ and $TiO_x$ film can be formed by using an apparatus or target which is used in manufacturing a magnetic film for TMR. Threrefore, the manufacturing cost can be made low.

$TiO_x$ film can also be formed by utilizing a target or apparatus used in the manufacturing process of LSIs. Therefore, the manufacturing cost can be made low.

Nitrides such as AlN and $Si_3N_4$, or oxynitrides thereof can be formed by using the same target and apparatus, using $N_2$ gas, or $NH_3$ gas as the work gas, or the mixture of $N_2$ or $NH_3$ gas and $O_2$ gas. Further, it becomes possible to form a dense film having an improved film quality, capable of enhancing reliability.

Any species of film or any composition can be formed by similar methods, to provide a tunnel barrier film having a similar oxygen concentration profile or nitrogen concentration profile to that in the above-described aluminum oxide film.

(5) Although Cu, Ti, Cr or the like is used as the material of the electrode layer 12A, conductive and non-magnetic metal material such as W, Ta, Au and Mo may also be used. These metal materials may also be used as the material of the electrode layer 26.

What is claimed is:

1. A tunneling junction element comprising:
   a substrate;
   a lower conductive layer formed on said substrate;
   a first oxide layer formed on said lower conductive layer and having a non-stoichiometric composition;
   a second oxide layer formed on said first oxide layer and having a stoichiometric composition; and
   an upper conductive layer formed on said second oxide layer,
   wherein said first oxide layer is oxidized during a process of forming said second oxide layer and has an oxygen concentration which is lower than an oxygen concentration of said second oxide layer and lowers with a depth in said first oxide layer, and said first and second oxide layers form a tunneling barrier.

2. A tunneling junction element according to claim 1, wherein said lower conductive layer has a natural oxide film formed on a surface of said lower conductive layer, and said first oxide layer has an oxygen concentration lower than an oxygen concentration of said natural oxide film at an interface with said lower conductive layer.

3. A tunneling junction element according to claim 1, wherein said lower conductive layer is a conductive layer with a surface natural oxide film being removed, and said first oxide layer has an oxygen concentration lower than an oxygen concentration of said removed natural oxide film at an interface with said lower conductive layer.

4. A tunneling junction element according to claim 1, wherein the oxygen concentration of said first oxide layer has a value substantially negligible at the interface with said lower conductive layer.

5. A tunneling junction element according to claim 1, wherein said lower conductive layer includes an antiferromagnetic layer and a ferromagnetic layer, and said upper conductive layer includes a ferromagnetic layer.

6. A tunneling junction element according to claim 5, wherein said lower conductive layer further includes an electrode layer formed under said antiferromagnetic layer.

7. A tunneling junction element according to claim 1, wherein said first and second oxide layers are aluminum oxide layers.

8. A tunneling junction element according to claim 1, wherein said second oxide layer has a thickness of about 0.5 nm to about 2.5 nm.

* * * * *